United States Patent
Mauri

(10) Patent No.: US 6,319,755 B1
(45) Date of Patent: Nov. 20, 2001

(54) CONDUCTIVE STRAP ATTACHMENT PROCESS THAT ALLOWS ELECTRICAL CONNECTOR BETWEEN AN INTEGRATED CIRCUIT DIE AND LEADFRAME

(75) Inventor: Philip S. Mauri, Laguna (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/452,545

(22) Filed: Dec. 1, 1999

(51) Int. Cl.⁷ .................... H01L 21/44; H01L 21/48; H01L 21/50
(52) U.S. Cl. .................... 438/119; 438/106
(58) Field of Search .................... 438/106, 119, 438/122, 123, 108, 118, 26, 48, 51, 64, 612, 613

(56) References Cited

U.S. PATENT DOCUMENTS

| | | | |
|---|---|---|---|
| 4,189,342 | 2/1980 | Kock | 156/656 |
| 4,935,803 | 6/1990 | Kalfus et al. | 357/68 |
| 5,218,231 | 6/1993 | Kudo | 257/735 |
| 5,266,834 | 11/1993 | Nishi et al. | 257/706 |
| 5,544,412 | 8/1996 | Romero et al. | 29/832 |
| 5,665,996 | 9/1997 | Williams et al. | 257/401 |
| 5,814,884 | * 9/1998 | Davis et al. | 257/723 |
| 6,040,626 | * 3/2000 | Cheah et al. | 257/735 |

FOREIGN PATENT DOCUMENTS

| | | |
|---|---|---|
| 0720225 A2 | 7/1996 | (EP) . |
| 0720234 A2 | 7/1996 | (EP) . |
| 60-116239 | 8/1985 | (JP) . |
| 8-64634 | 3/1996 | (JP) . |

OTHER PUBLICATIONS

Provisional U.S. Patent application No. 60/101,810, filed Sep. 25, 1998, published Mar. 21, 2000 upon issuance of U.S. Patent No. 6,040,626.
http://www.siliconix.com, "New Package Technology Yields Nearly Twofold Improvement Over Previous State–of–the–art," Vishay Siliconix Press Release, Dec. 9, 1998.
Mannion, P., "MOSFETs Break Out Of The Shackles Of Wirebonding", Electronic Design, vol. 47, No. 6 (Mar. 22, 1999).

* cited by examiner

Primary Examiner—David Nelms
Assistant Examiner—David Nhu
(74) Attorney, Agent, or Firm—Skjerven Morrill MacPherson LLP; James E. Parsons; Bernice B. Chen

(57) ABSTRACT

A method of making an integrated circuit package is disclosed. A conductive first adhesive is applied onto a leadframe pad of a leadframe. A conductive second adhesive is applied on an input portion of the leadframe, such as a leadframe member that is integral with inner portions of input leadfingers. An integrated circuit die, such as a power MOSFET, is placed on the first adhesive on the leadframe pad. A conductive third adhesive is applied onto a surface of the integrated circuit die opposite the leadframe pad. A conductive strap is placed on the third adhesive on the integrated circuit die and on the second adhesive on the leadframe. The first, second and third adhesives are then simultaneously cured so that the integrated circuit die is permanently attached to the leadframe pad, and the conductive strap is permanently attached to the die and the leadframe member.

20 Claims, 6 Drawing Sheets

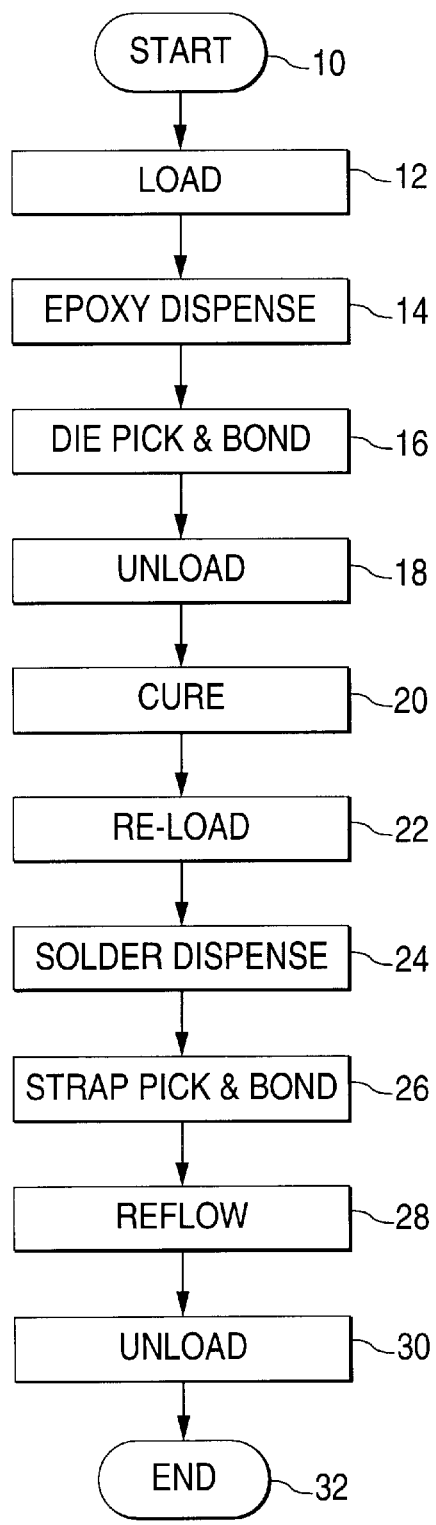
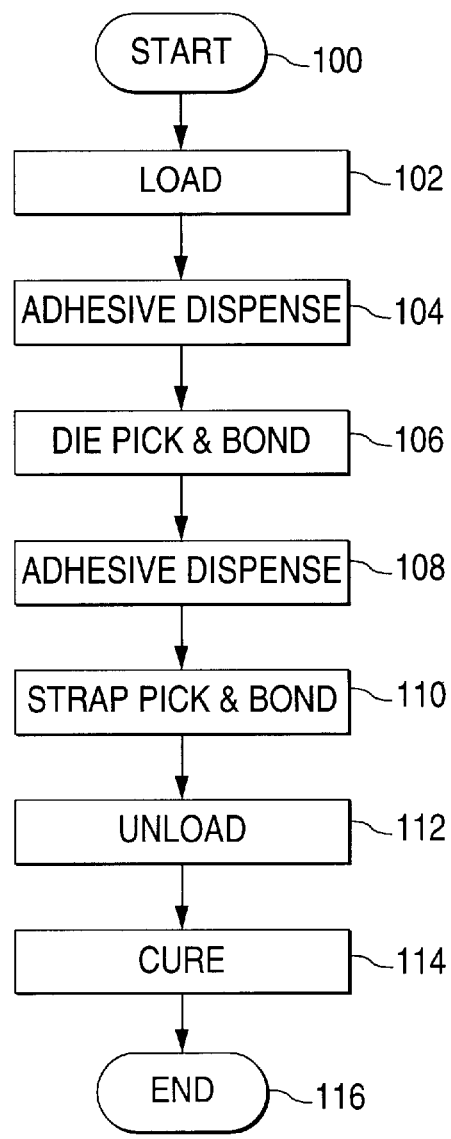
FIG. 1
(PRIOR ART)
FIG. 6

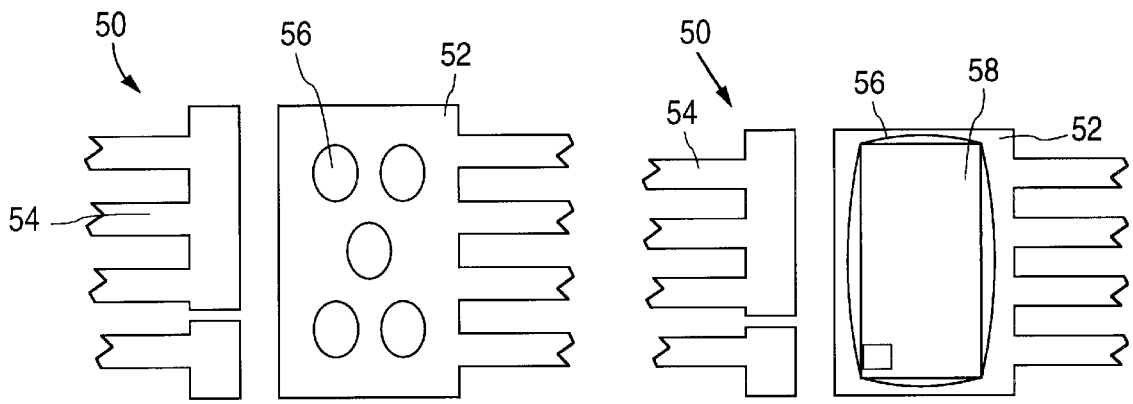
FIG. 2
(PRIOR ART)
FIG. 3A
(PRIOR ART)
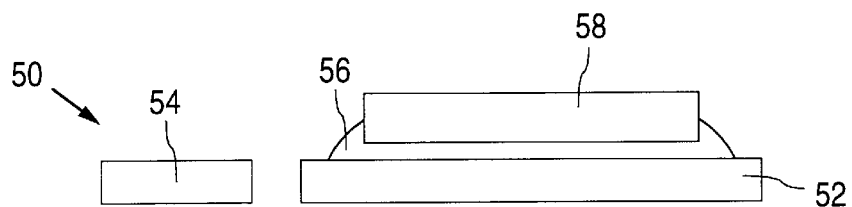
FIG. 3B
(PRIOR ART)
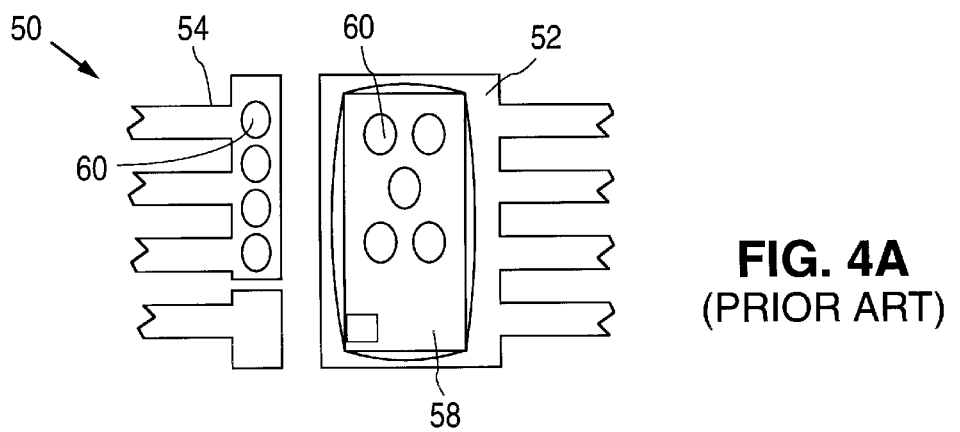
FIG. 4A
(PRIOR ART)
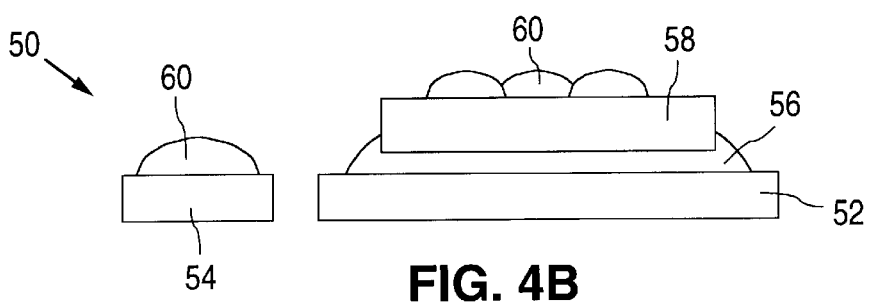
FIG. 4B
(PRIOR ART)

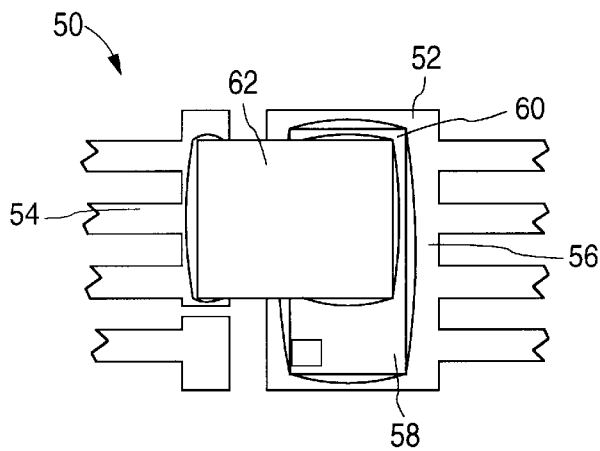
FIG. 5A
(PRIOR ART)
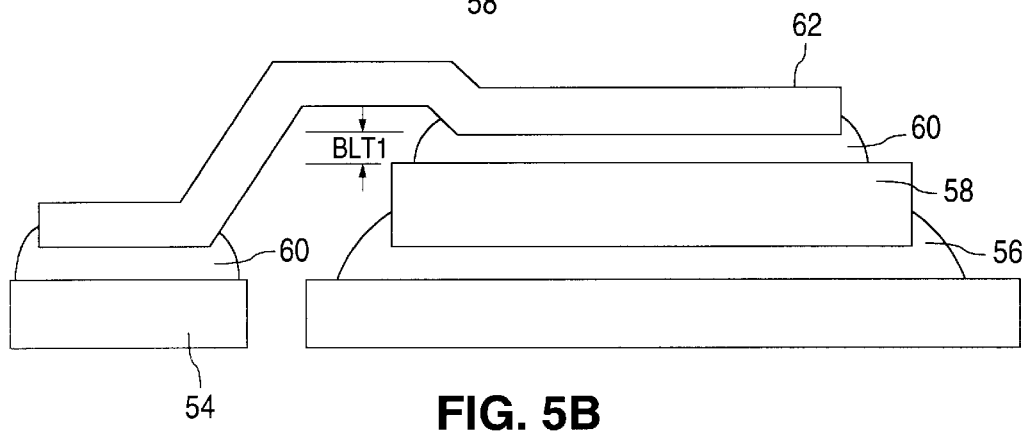
FIG. 5B
(PRIOR ART)
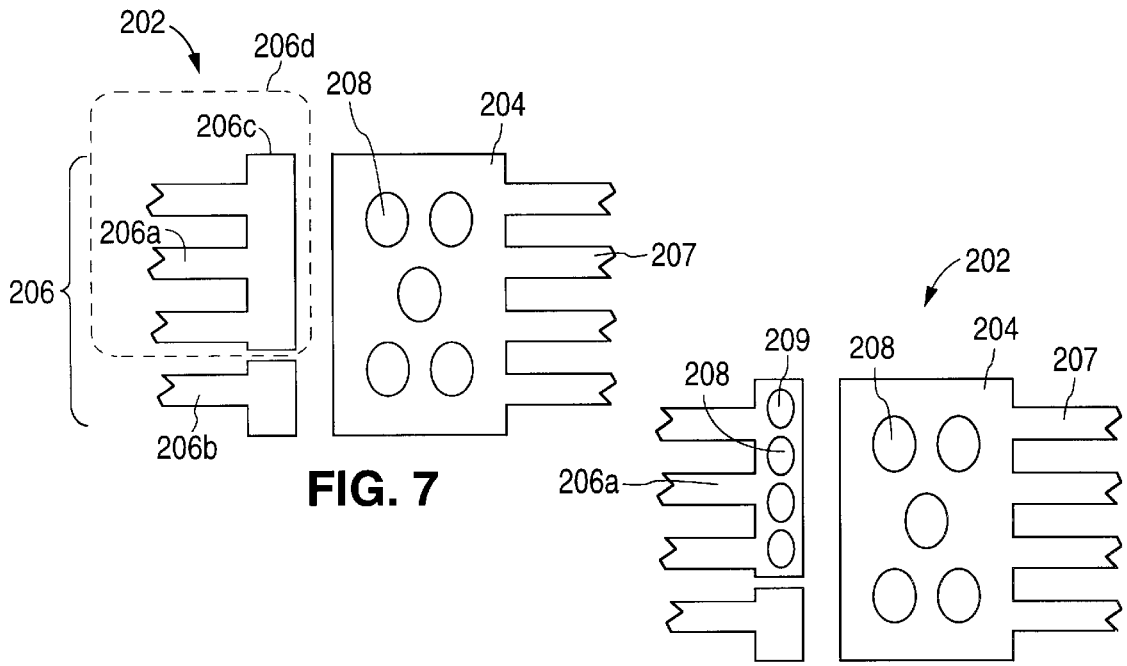
FIG. 7
FIG. 8

CONDUCTIVE STRAP ATTACHMENT PROCESS THAT ALLOWS ELECTRICAL CONNECTOR BETWEEN AN INTEGRATED CIRCUIT DIE AND LEADFRAME

FIELD OF THE INVENTION

The present invention relates to a method of making an integrated circuit package, and in particular to a process for attaching a conductive strap to an integrated circuit die and a leadframe.

BACKGROUND OF THE INVENTION

A typical integrated circuit package includes an integrated circuit die attached to a leadframe, the leadframe being the backbone of a typical molded plastic package. Leadframes serve first as a die support fixture during the assembly process, and are subsequently electrically connected to the die bond pads after die-attach by wirebonding. After molding, the leadframe becomes an integral part of the package. The package includes external terminals (e.g., leadfingers) for power and signal distribution. In addition, the package may provide for heat dissipation.

As is well known in the art, high-resistance and thermally inefficient integrated circuit devices significantly reduce system reliability and electrical efficiency. One of the factors contributing to such inefficiency involves the use of wirebond connections between the package's leadfingers and the die. Such wirebonds contribute a large percentage of the overall package resistance. In addition, wirebond cratering and a so-called "purple plague" phenomena associated with wirebonds affect device reliability. "Purple plague" is a phenomenon when gold (the typical material for bond wires) is combined with an aluminum top metal on the die. When gold is combined with an aluminum top metal, intermetallic formations may result, which can cause open circuits.

Another contributing factor of device inefficiency is inadequate heat dissipation. For example, heat from a power MOSFET (Metal-Oxide-Semiconductor Field-Effect-Transistor) device on a printed circuit board (PCB) typically is removed through a plate that forms the drain-lead connection on the back of the die. The plate conducts heat to the PCB through a conductive connection. With smaller devices and higher power, such heat dissipation may not be adequate in some applications.

To improve device resistance and heat dissipation in power MOSFET applications while keeping a small package size, a copper strap has been developed to eliminate the wirebonds associated with the source inputs of the power MOSFET device. By replacing the wirebonds connecting the source to the leadframe with a solid copper strap, a highly conductive (both thermally and electrically) path between the leadframe and the die is created. The reduction in thermal and electrical resistance allows for, e.g., less paralleling of devices, smaller chips and package outlines and higher reliability. Circumventing wirebonding also allows a decrease in assembly time and elimination of the cratering and purple plague phenomena associated with wirebonds.

In addition, the copper strap creates a low-resistance parallel path with the die's top surface, further reducing package resistance. Heat dissipation also is improved because the copper strap provides two thermal-dissipation avenues - one through the source leadfingers to the PC board and the other through a top surface of the package, since the copper strap is routed close to the top of the mold compound encapsulant and thus facilitates heat radiation from the top surface of the package.

FIG. 1 illustrates a flowchart of a conventional assembly process for a power MOSFET package employing a copper strap. FIGS. 2, 3A, 3B, 4A, 4B, 5A and 5B show various stages during the assembly process. The process starts in Step 10.

Referring to FIGS. 1 and 2, Step 12 loads a leadframe 50 into a typical die attach machine. Step 14 dispenses a conductive adhesive epoxy 56 onto a leadframe pad 52 of leadframe 50. Step 16 picks a die 58 from a wafer tape (not shown) and places die 58 on top of conductive epoxy 56 on leadframe pad 52 (FIGS. 3A and 3B) using a conventional method. Step 18 loads the die-bonded leadframe strips into transport magazines and then unloads the transport magazines from the die attach machine. Step 20 loads the transport magazines into a conventional curing oven for a first curing step, wherein conductive epoxy 56 is cured.

Subsequent to curing conductive epoxy 56, Step 22 of FIG. 1 removes the magazines of die bonded leadframe strips from the oven and loads the leadframes into a solder paste dispensing system. Referring to FIGS. 4A and 4B, Step 24 dispenses a solder paste 60 onto a top surface of die 58 and input leadfingers 54. Step 26 of FIG. 1 singulates a copper strap 62 from a reel or a matrix reel. The copper strap 62 is then picked and placed onto the solder paste 60 on die 58 and input leadfingers 54. FIGS. 5A and 5B show top and side views of copper strap 62 on die 58 and input leadfingers 54.

Step 28 of FIG. 1 loads the leadframe units into a reflow oven for a second curing step wherein solder paste 60 is cured. Referring to FIG. 5B, a problem associated with Step 28 is that, after solder paste 60 curing, the bond line thickness BLT1 at the bottom of copper strap 62 is uncontrolled. The leadframe units are then placed into another transport magazine in preparation for subsequent steps. Once the transport magazine is full, the units are unloaded from the oven in Step 30. The process ends in Step 32.

The process of FIG. 1 requires the use of both an epoxy and solder paste, and accordingly requires two curing steps, namely, an epoxy cure for die attach and a solder paste cure for copper strap attach. Artisans will appreciate that the cost of packaging an integrated circuit die depends, in part, on the materials used and the number of steps of the packaging process.

Therefore, what is needed is a less costly and more efficient method of packaging an integrated circuit die. In particular, what is needed is a more efficient method of attaching a conductive strap that allows electrical connection between a leadframe and an integrated circuit die.

SUMMARY OF THE INVENTION

The present invention lowers material costs and improves the efficiency of an integrated circuit die packaging process where a conductive strap is used to interconnect a leadframe and an integrated circuit die. The present invention also improves the reliability of the package.

An embodiment of a method within the present invention includes applying a conductive first adhesive on a leadframe pad of a leadframe. A conductive second adhesive is applied on a member of the leadframe that is connected to one or more input leadfingers. A first surface of an integrated circuit die is placed on the leadframe pad through the first adhesive. A conductive third adhesive is applied on second surface of the integrated circuit die opposite the first surface. A conductive strap is placed on the second surface of the integrated circuit die through the third adhesive and on the leadframe member through the second adhesive. The first, second and third adhesives are simultaneously cured, which permanently attaches the die to the leadframe pad and the conductive strap to the die and the leadframe.

In one embodiment, the first, second and third adhesives are conductive epoxy materials. The first, second and third adhesives may be the same material, or may be different materials provided that they can cure simultaneously.

In one embodiment, the integrated circuit die comprises a power MOSFET having a source input conductively connected to input leadfingers via the conductive strap, a gate input connected to a leadfinger by a wire bond or other conductor, and a drain output conductively connected to the leadframe pad.

In one embodiment, the second adhesive is applied prior to placement of the die on the first adhesive. In an alternative embodiment, the second adhesive is applied subsequent to placement of the die on the first adhesive.

By replacing solder paste with a conductive adhesive (e.g., silver-filled epoxy) to electrically connect the conductive strap to the die and the leadframe, only one curing step is needed, thereby simplifying the packaging process and improving manufacturability of the package. In addition, assembly yield loss due to multiple handling steps is reduced and bond line thickness control is improved.

These and other objects, features and advantages of the present invention will be more readily apparent from the figures and the detailed description set forth below.

BRIEF DESCRIPTION OF DRAWINGS

FIG. 1 is a flowchart of a conventional method of assembling an integrated circuit package having a conductive strap.

FIG. 2 is a top view of conductive epoxy dispensed on a leadframe pad.

FIGS. 3A and 3B are top and side views of a die attached to the leadframe pad.

FIGS. 4A and 4B are top and side views, respectively, of solder paste dispensed on a top face of the die.

FIGS. 5A and 5B are top and side views of a copper strap on the input leadfingers of the leadframe and the die.

FIG. 6 is a flowchart of a method in accordance with the present invention of assembling integrated circuit package having a conductive strap.

FIG. 7 is a top view of a conductive adhesive applied on a leadframe pad.

FIG. 8 is a top view of a conductive adhesive applied on a portion of a leadframe to which a conductive strap will be attached.

The use of the same reference symbols in different drawings indicates similar or identical items.

DETAILED DESCRIPTION

Figure 9A:
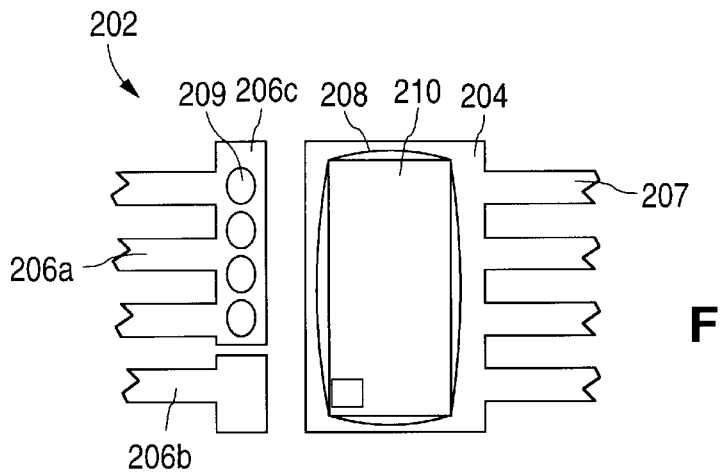
FIGS. 9A and 9B are top and side views of a die on the leadframe pad.

FIG. 6 is a flowchart of an exemplary method within the present invention of assembling an integrated circuit package. FIGS. 7, 8, 9A, 9B, 10A, 10B, 11A and 11B provide views at various stages of the process.

The process starts in Step 100, where a metal leadframe strip comprising an array of metal leadframes is provided. Tooling or indexing holes are located along the leadframe strip edges to mate with transfer mechanism elements and alignment pins of the assembly equipment. For ease of explanation, only one leadframe is described below.

Referring to FIG. 7, leadframe 202 is made of a conventional leadframe metal, such as, but not limited to, copper, copper alloys, and Alloy 42, among others. The leadframe 202 may be plated with a variety of conventional plating metals.

Leadframe 202 includes a leadframe pad 204 and a plurality of leadfingers (e.g., input leadfingers 206 and output leadfingers 207). Leadframe pad 204 provides a die mounting site while leadfingers 206 and 207 provide for electrical connections between the circuitry on an integrated circuit die 210 (FIG. 9A) and an external printed circuit board or other device (not shown). Input leadfingers 206a are integrally connected at their inner ends by a conductive member 206c that is adjacent to leadframe pad 204.

In one embodiment of a package for a power MOSFET device, input leadfingers 206a are source leads; input leadfinger 206b is a gate lead; and output leadfingers 207 are drain leads of the package.

Step 102 of FIG. 6 loads the leadframe strip into a conventional die attach machine. As an example, an ALPHASEM SL9003 or a SL8003 die attach machine may be used. Steps 102–112 of FIG. 6 (i.e., up through the curing step) are performed in a single pass through the die attach machine.

In Step 104 of FIG. 6, a conductive adhesive 208 is applied by the die attach machine onto leadframe pad 204. Referring to FIG. 7, five dots of adhesive 208 are applied to leadframe pad 204, but other arrangements of adhesive 208 also may be used. An alternative Step 104 shown in FIG. 8 applies adhesive 208 to leadframe pad 204 and also applies adhesive 209 to leadframe member 206c.

Figure 9B:
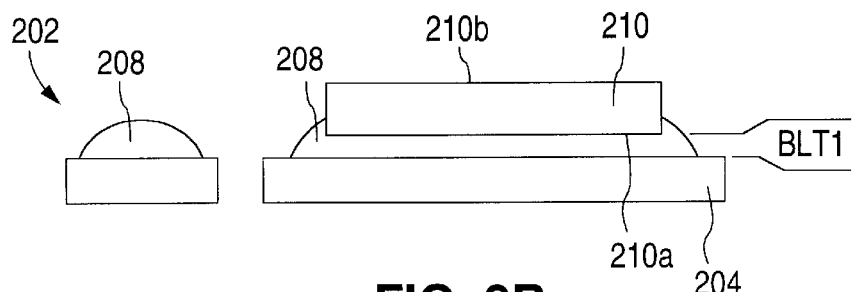

After adhesive 208 has been applied onto leadframe pad 204, Step 106 of FIG. 6 picks a die 210 from a wafer tape (not shown) and places the die 210 on adhesive 208 on leadframe pad 204. FIG. 9A and FIG. 9B show top and side views of die 210 on adhesive 208 on leadframe pad 204. Die 210 has a lower first surface 210a on adhesive 208, and an opposite upper second surface 210b. In power MOSFET applications, first surface 210a an second surface 210b of die 210 are typically coated with a conductive material, such as aluminum or some other metal.

Figure 10A:
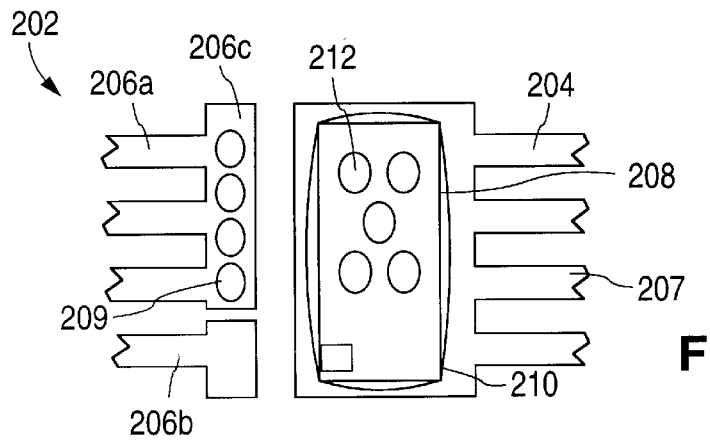
FIGS. 10A and 10B are top and side views of a conductive adhesive applied on a top surface of the die and the leadframe.
Figure 10B:
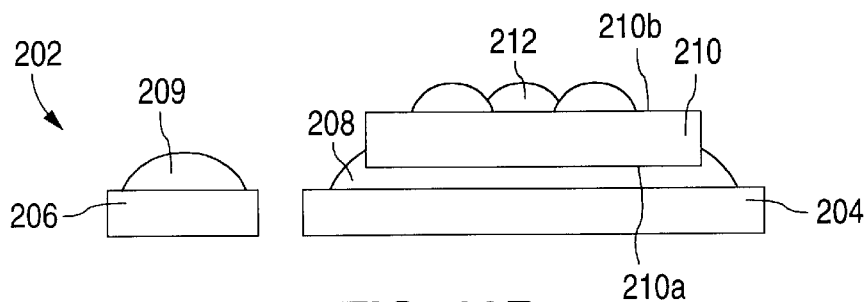

Referring to FIGS. 10A and 10B, Step 108 of FIG. 6 applies conductive adhesive 212 onto second surface 210b of die 210. Step 108 also applies conductive adhesive 209 to leadframe member 206c, unless conductive adhesive 209 already was applied in Step 104. FIGS. 10A and 10B show top and side views, respectively, after conductive adhesive 212 has been applied to second surface 210b of die 210 and after conductive adhesive 209 has been applied to member 206c.

Figure 11A:
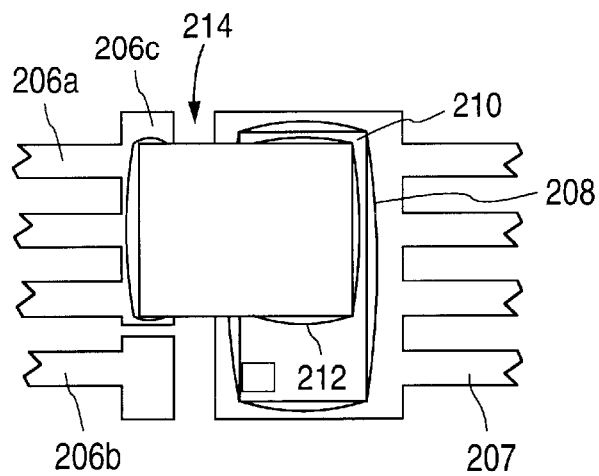
FIGS. 11A and 11B are top and side views of a conductive strap attached to the leadframe and the die.
Figure 11B:
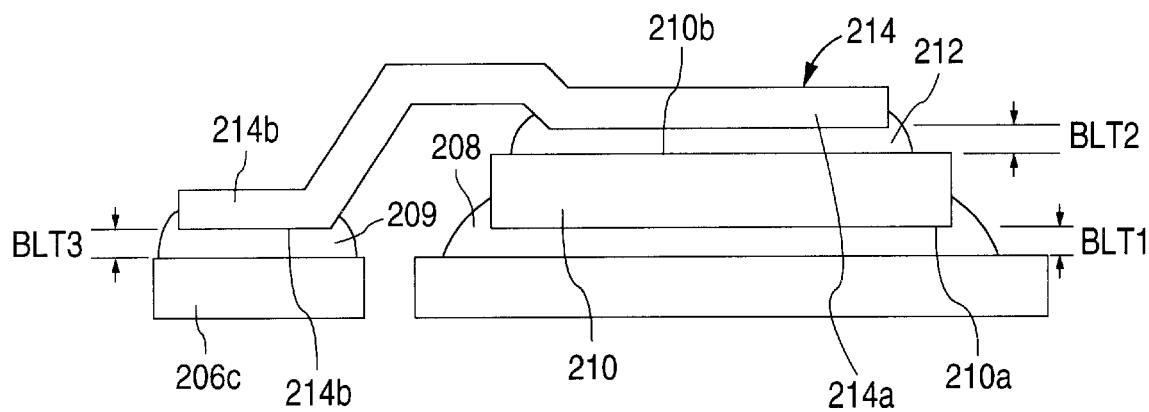

Referring to FIGS. 11A and 11B, Step 110 of FIG. 6 singulates a conductive strap 214 from a reel or a matrix reel and then picks and places a right-most end of conductive strap 214 onto adhesive 212 on second surface 210b of die 210 and a left-most end of strap 214 onto adhesive 209 on leadframe member 206c. FIGS. 11A and 11B show top and side views of a conductive strap 214 having a planar first surface 214a on die 210, and a planar second surface 214b on leadframe member 206c.

Conductive strap 214 needs to be conductive to provide electrical connection between die 210 and leadfingers 206a. In one embodiment, conductive strap 214 is made of copper (Cu). Other conductive materials such as copper alloys, aluminum (Al) and aluminum alloys may also be used for strap 214. The size of conductive strap 214 depends on the size of die 210 and the application of the integrated circuit device. In a power MOSFET application, for example, conductive strap 214 may cover up to approximately 70% of second surface 210b of die 210. An exemplary strap 214 is approximately 2667 microns by approximately 2641 microns. In general, a clearance of approximately 254 microns from the edge of die 210 should be maintained.

Step 110 is repeated until a conductive strap 214 is placed onto each die 210 and leadframe 202 of the leadframe strip through conductive adhesives 212 and 209, respectively. When Step 110 is completed, Step 112 of FIG. 6 loads the leadframe strip into a transport magazine and unloads the die attach machine.

Step 114 of FIG. 6 places the magazine of leadframe strips into a conventional convection curing oven (not shown). Subsequently, Step 114 simultaneously cures conductive adhesives 208, 209, and 212. In particular, conductive adhesive 208 is cured so that first surface 210a of die 210 is permanently attached thereby to leadframe pad 204, and conductive adhesives 209 and 212 are cured so that conductive strap 214 is permanently attached thereby to leadframe member 206c and second surface 210b of die 210, respectively. Step 116 ends the process of FIG. 6.

Figure 14:
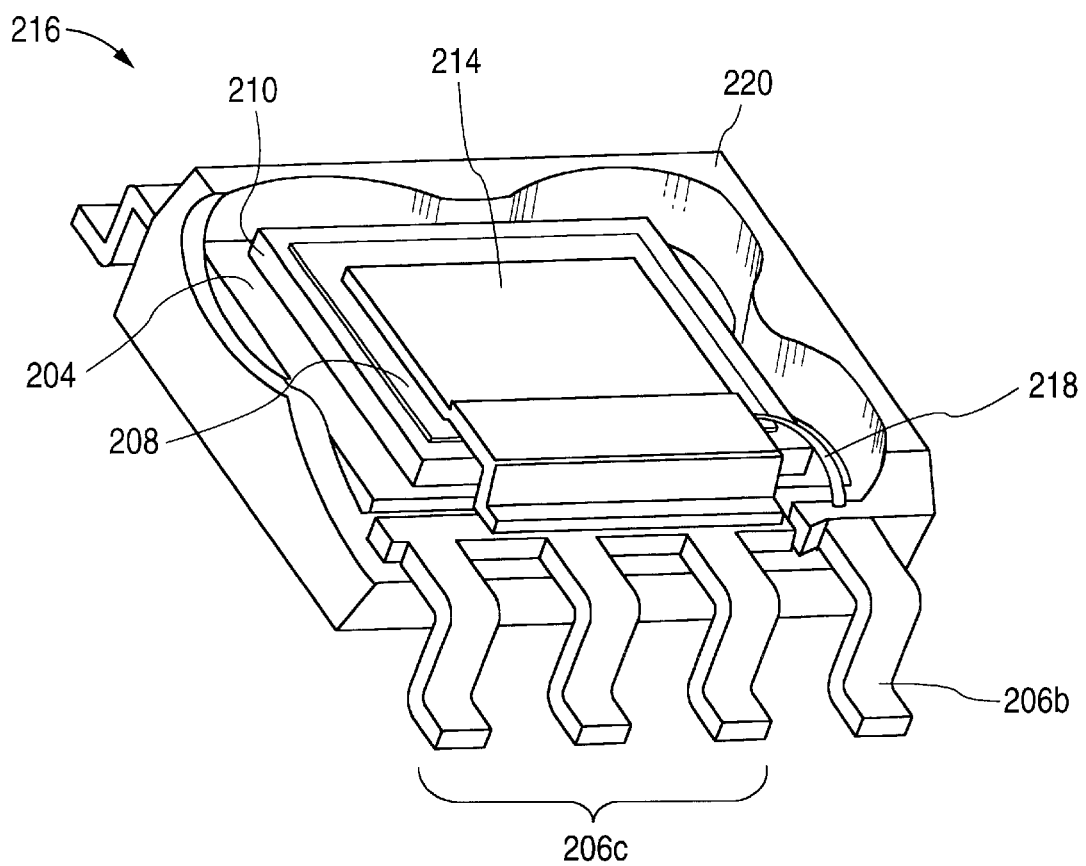
FIG. 14 is a partially broken perspective view of an exemplary integrated circuit package assembled using the method of FIG. 6.

FIG. 14 is a partially broken perspective view of an embodiment of an integrated circuit package 216 assembled using the method of FIG. 6. In particular, package 216 is a power MOSFET package. Assembly steps subsequent to the method of FIG. 6 include encapsulation of die 210, strap 214, wirebond 218 and the inner ends of leadfingers 206 and 207 in an insulative and protective encapsulant material 220. In one embodiment, the package is encapsulated using conventional transfer molding techniques and materials. Examples of molding compounds include EME7200 from the Sumitomo Company and KE300 from the Toshiba Company. It is noted that the properties of the molding compound should be selected to optimize thermal, mechanical and moisture resistance of the device. The location of much of strap 214 proximate to the upper surface of package 216 allows enhanced heat dissipation.

As discussed above, adhesives 208, 209, and 212 are conductive materials that simultaneously harden upon curing and thereby permanently attach die 210 to leadframe pad 202 and conductive strap 214 to die 210 and leadframe 202. Adhesives 208, 209 and 212 may be the same type of material. Alternatively, one or all of adhesive materials 208, 209, and 212 may differ from each other, although in such cases the materials selected should cure simultaneously in Step 114 of FIG. 6. None of adhesives 208, 209, or 212 is solder. Solder paste 60 of FIGS. 4A and 4B is eliminated.

Adhesives 208, 209, and 212 may be any conventional conductive curable die attach adhesive such as a silver-filled conductive epoxy or other organic-based adhesives. As a further example, epoxies such as 84-1LMISR4, LMIT1 or 8361 epoxies from the ABLESTIK Company, or A3 from the BELLHITEC Company are some examples of adhesives 208, 209 and 212. It is noted that the adhesive materials should be selected such that die 210 is not subject to excessive strain during the curing step.

Referring to FIG. 11B, the amount of material applied as adhesives 208, 209, and 212 in Steps 104 and 108 is controlled so that the bond line thickness between die 210 and leadframe pad 204 (shown as BLT1), the bond line thickness between strap 214 and die 210 (shown as BLT2), and the bond line thickness between strap 214 and leadframe member 206c (shown as BLT3) are within ranges specified for the particular packaging application. A typical bond line thickness range is 2.54 microns to 25.4 microns. The bond line thickness affects the electrical performance of the package and is generally controlled by the amount of adhesive applied and the z-travel (i.e., height travel) of the bond arm of the die attach machine. As an example, in a power MOSFET application where ABLESTIK 84-1LMISR4 epoxy adhesive is used for adhesives 208, 209, and 212, a bond line thickness of approximately 12.7 microns is obtained between die 210 and leadframe pad 204 (BLT1) and between strap 214 and die 210 and leadframe member 206c (BLT2 and BLT3, respectively).

The curing conditions used in Step 114 of FIG. 6 depend on the materials and amounts of conductive adhesives 208, 209, and 212 used. For example, typical curing conditions for ABLESTIK 84-1LMISR4 epoxy include heating to a temperature in the range of approximately 170° C. to 180° C. for a time of about 60 minutes. Conventional convection curing ovens are used.

The process of FIG. 6 has the advantage of not exposing devices to high temperature reflow ovens associated with solder paste curing because solder paste is eliminated from the packaging process. In addition, the die attach and conductive strap attach processes are more efficient because they are performed in a single pass through the die attach machine. Furthermore, bond line thickness may be controlled more consistently because the same or similar adhesive materials are used for the die attach and the conductive strap attach steps and only a single adhesive curing step is used. Moreover, the overall equipment utilization is improved due to the removal of solder reflow process and associated cleaning processes.

Figure 12:
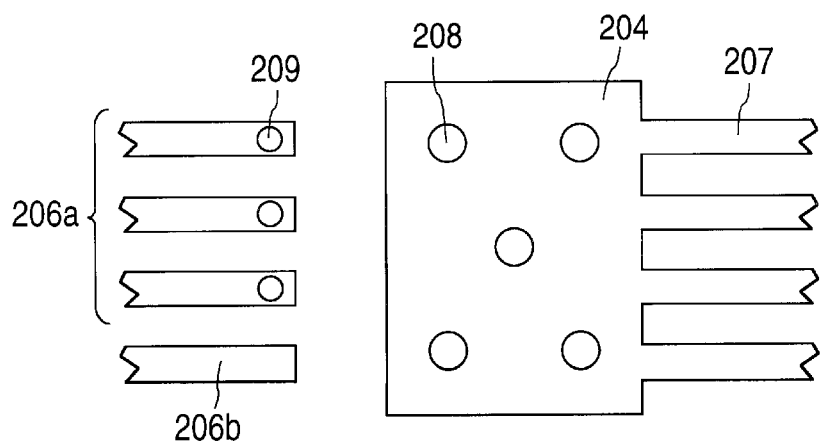
FIG. 12 is a top view of a leadframe having unconnected input leadfingers.
Figure 13:
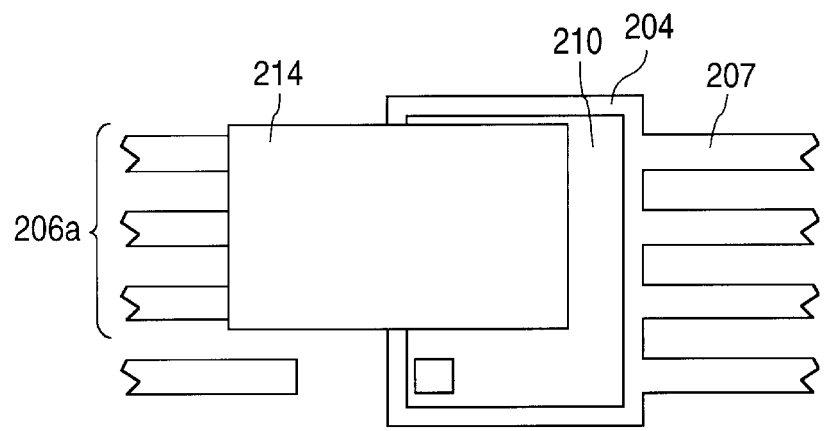
FIG. 13 is a top view of a conductive strap attached to individual input leadfingers and the die.

As discussed above with respect to FIG. 7, leadframe 202 includes a plurality of input leadfingers 206a connected by member 206c. Conductive adhesive 209 is applied onto leadframe member 206c. However, input leadfingers 206a need not be connected by a conductive member, as shown in FIG. 12. In this alternative embodiment, at least one drop of conductive adhesive 209 is applied onto an inner end portion of individual leadfingers 206a. Conductive strap 214 is then placed onto the adhesive 209 on leadfingers 206a and on die 210 so that, after curing, conductive strap 214 is physically and electrically connected between leadfingers 206a and die 210, as shown in FIG. 13. Other process steps for this alternative embodiment are similar to those described above in conjunction with FIG. 6.

The embodiments described herein are merely examples of the present invention. Artisans will appreciate that variations are possible within the scope of the claims.

I claim:

1. A method of assembling an integrated circuit package, the method comprising:

applying a conductive first adhesive onto a first portion of a conductive leadframe;

applying a conductive second adhesive on a second portion of the conductive leadframe;

placing a first surface of an integrated circuit die on the first adhesive;

applying a conductive third adhesive on a second surface of the integrated circuit die opposite the first surface;

placing a conductive strap on the third adhesive and on the second adhesive; and simultaneously curing the conductive first, second and third adhesives in only one curing step so that the integrated circuit die is conductively attached to the first portion of the conductive leadframe and the strap is conductively attached between the integrated circuit die and the second portion of the conductive leadframe.

2. The method of claim 1, wherein the conductive first, second and third adhesives comprise an epoxy.

3. The method of claim 1, wherein the conductive first, second, and third adhesives comprise an organic material.

4. The method of claim 1, wherein the conductive first, second and third adhesives are the same material.

5. The method of claim 1, wherein one or more of the conductive first, second, and third adhesives is a different material than the others of the conductive first, second, and third adhesives.

6. The method of claim 1, wherein the first portion of the conductive leadframe comprises a planar pad, the pad being conductively connected to one or more leadfingers of the conductive leadframe.

7. The method of claim 6, wherein the pad is integrally connected to the one or more leadfingers.

8. The method of claim 1, wherein the second portion of the conductive leadframe is conductively connected to one or more leadfingers of the conductive leadframe.

9. The method of claim 8, wherein the second portion of the conductive leadframe comprises a member integrally connected to the one or more leadfingers.

10. The method of claim 1, wherein the second portion of the conductive leadframe comprises one or more leadfingers.

11. The method of claim 6, wherein the second portion of the conductive leadframe is conductively connected to one or more leadfingers of the conductive leadframe.

12. The method of claim 7, wherein the second portion of the conductive leadframe comprises a member integrally connected to the one or more leadfingers.

13. The method of claim 1, wherein applying the conductive second adhesive is performed prior to placing the first surface of the integrated circuit die onto the first portion of the conductive leadframe.

14. The method of claim 1, wherein applying the conductive second adhesive is performed subsequent to placing the first surface of the integrated circuit die onto the first portion of the conductive leadframe.

15. The method of claim 1, wherein the conductive strap comprises a material selected from the group consisting of copper, copper alloy, aluminum and aluminum alloy.

16. The method of claim 1, further comprising applying the conductive first, second, and third adhesives and placing the die and conductive strap in a single pass through a machine.

17. The method of claim 1, further comprising electrically connecting a wirebond between the integrated circuit die and the conductive leadframe.

18. A method of assembling an integrated circuit package, the method comprising:

applying a conductive first adhesive and a conductive second adhesive on to respective portions of a metal leadframe;

placing an integrated circuit die on the first adhesive;

applying a conductive third adhesive on the integrated circuit die opposite the conductive first adhesive;

placing a conductive strap on the integrated circuit die through the conductive third adhesive and on the leadframe through the conductive second adhesive, wherein applying the conductive first, second, and third adhesives and placing the integrated circuit die and conductive strap are done in a single pass through a machine; and curing the conductive first, second and third adhesives in only one curing step so that the integrated circuit die is conductively attached the leadframe and the strap is conductively attached between the integrated circuit die and the leadframe.

19. The method of claim 18, further comprising electrically connecting a wirebond between the integrated circuit die and the conductive leadframe.

20. The method of claim 18, wherein the conductive first, second, and third adhesives are epoxy-based.

* * * * *

UNITED STATES PATENT AND TRADEMARK OFFICE
CERTIFICATE OF CORRECTION

PATENT NO. : 6,319,755 B1
DATED : November 20, 2001
INVENTOR(S) : Philip S. Mauri It is certified that error appears in the above-identified patent and that said Letters Patent is hereby corrected as shown below:

Column 2,
Line 17, after "curing" insert -- of --;
Line 63, after "on" insert -- a --;

Column 3,
Line 39, delete "face" and insert -- surface --;
Line 44, after "assembling" insert -- an --; and Column 4,
Line 52, delete "an" and insert -- and --.

Signed and Sealed this

Twenty-eighth Day of January, 2003

JAMES E. ROGAN
*Director of the United States Patent and Trademark Office*